US006429607B1

United States Patent
Gordon et al.

(12) United States Patent
(10) Patent No.: US 6,429,607 B1
(45) Date of Patent: Aug. 6, 2002

(54) CONSTANT POWER DYNAMIC FOCUS COIL

(75) Inventors: Michael S. Gordon, Lincolndale; Maris A. Sturans, Wappingers Falls, both of NY (US)

(73) Assignee: International Business Machines Corporation, Armonk, NY (US)

( * ) Notice: Subject to any disclaimer, the term of this patent is extended or adjusted under 35 U.S.C. 154(b) by 113 days.

(21) Appl. No.: 09/640,109

(22) Filed: Aug. 15, 2000

(51) Int. Cl.[7] .................................................. H01J 29/58
(52) U.S. Cl. ............................... 315/382; 250/396 ML; 250/396 R; 250/298
(58) Field of Search ..................... 250/396 ML, 396 R, 250/298; 315/382

(56) References Cited

U.S. PATENT DOCUMENTS

| | | | |
|---|---|---|---|
| 3,843,945 A | 10/1974 | Koning | 335/217 |
| 3,939,403 A | 2/1976 | Stassart | 324/40 |
| 4,429,258 A * | 1/1984 | Bendell | 315/382 |

FOREIGN PATENT DOCUMENTS

| | | |
|---|---|---|
| JP | 59081850 | 5/1984 |
| JP | 60157206 | 8/1985 |
| JP | 63043306 | 2/1988 |
| SU | 684648 | 9/1979 |

* cited by examiner

Primary Examiner—Bruce Anderson
Assistant Examiner—Nikita Wells
(74) Attorney, Agent, or Firm—Jay H. Anderson

(57) ABSTRACT

A dynamic focus coil produces different selected ampere-turns while consuming constant power and therefore maintaining constant temperature. The focus coil comprises a set of coils that all consume the same power. A selected subset of coils (e.g. two or three) are energized at any given time, the subset being selected to produce the desired focus adjustment. Illustratively, the coils all have the same resistance and are driven by current having the same magnitude and selectable polarity. An alternative embodiment contains a "coarse" set of coils having selected values of ampere turns and a "fine" set of coils having values of ampere turns that fill in between the values of the coarse set.

30 Claims, 6 Drawing Sheets

CONSTANT POWER DYNAMIC FOCUS COIL

FIELD OF THE INVENTION

The field of the invention is charged particle beam systems.

BACKGROUND OF THE INVENTION

Particle beam systems ordinarily contain at least one focus coil having a relatively quick response time for making adjustments in the focus plane of the beam.

A common problem with such coils is that, when the current changes in order to adjust the focus, the temperature changes. That, in turn, changes the permeability of the magnetic material in the lens being adjusted and also changes the dimensions of parts in thermal contact with the focus coil.

SUMMARY OF THE INVENTION

The invention relates to a focus coil mounted in proximity to a lens such that the focus coil adds or subtracts from the field of the lens and that provides a set of focus values while consuming the same power for each such value.

A feature of the invention is operation in bipolar mode—the coil is driven with current of the same magnitude but opposite sense, thereby consuming the same power while altering the focal plane of the system.

A feature of the invention is the ability to select dynamically a number of focal planes using magnetic coils without disturbing the thermal equilibrium of the system.

Another feature of the invention is the provision of a set of coils, each having the same total number of turns, but having selected numbers of contributing turns that contribute to the magnetic field, the remainder of the total number of turns being arranged in canceling pairs that produce no net magnetic field.

Another feature of the invention is the ability to select a subset of two or three coils (out of the total number of coils) to be energized simultaneously, the various coils combining to provide a range of focus values, with the same number of coils being energized for each focus value.

DESCRIPTION OF THE PREFERRED EMBODIMENT

Figure 1:
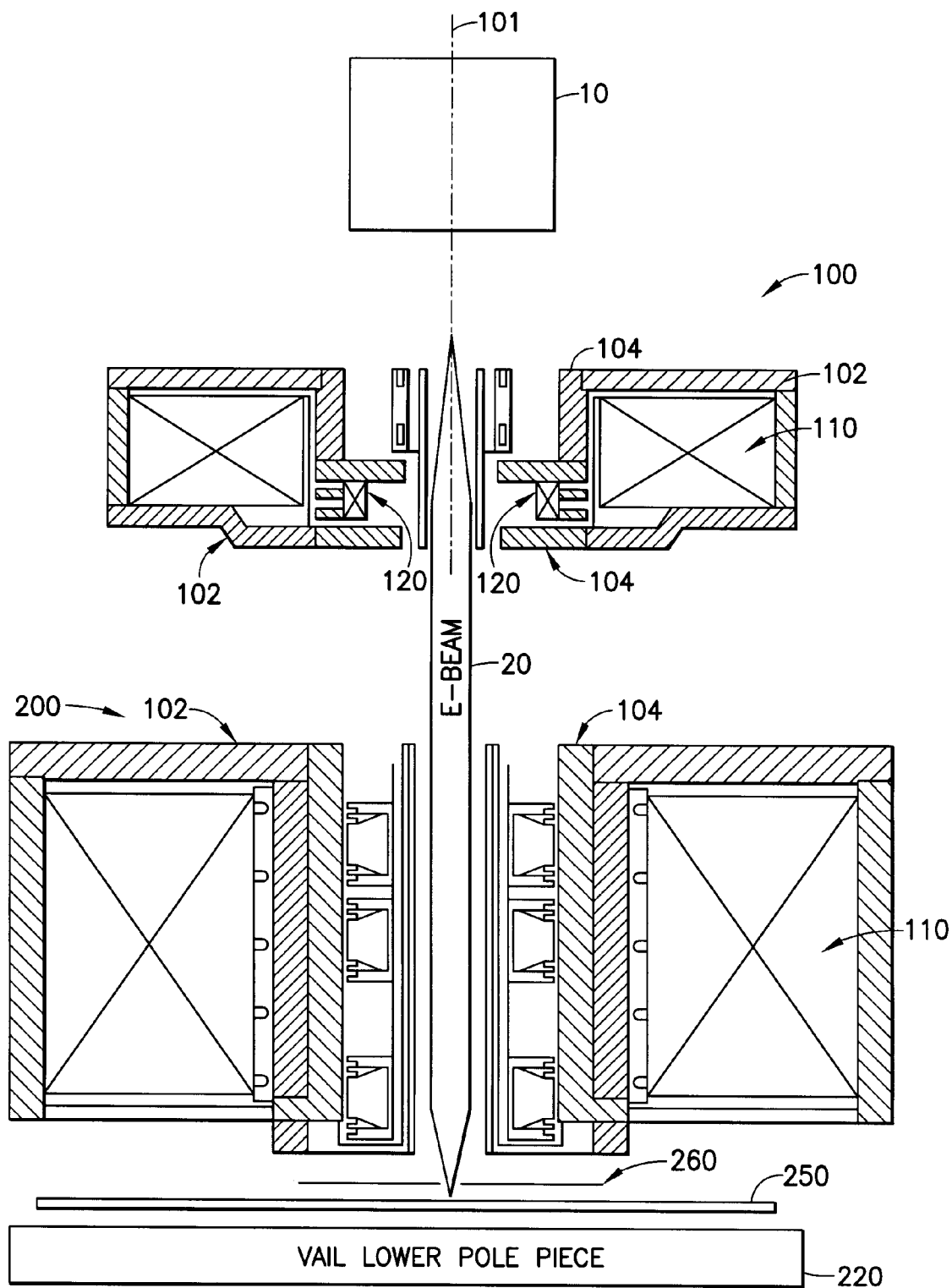
FIG. 1 shows in partially pictorial, partially schematic form a charged particle system using the invention.

Referring now to FIG. 1, there is shown a simplified example of a particle beam system. At the top of the Figure, a box denoted with the numeral 10 and positioned on system axis 101 represents schematically the upper portion of a system. In the case of a direct-write system, box 10 will contain the electron source and associated elements for shaping the beam e.g. a probe-forming system or a shaped-beam system. In the case of a projection system, box 10 will represent the electron source, the upper optical section for generating a collimated beam and directing the beam on a selected area of a reticle, the reticle and mechanical equipment for positioning it, etc.

In the lower portion of the figure, collimating lens 100 collimates beam 20 from the upper portion. Lens 100 comprises a conventional assembly of steel shell 102, lens coil 110 supplying the current to generate the magnetic field of the lens, and high permeability material 104 (referred to as ferrite) on the interior portion of the lens.

An important feature of lens 100 is the dynamic focus coil 120, shielded magnetically from the field of the main coil 110 by the ferrite and placed within the pole tips of lens 100. As those skilled in the art are aware, it is important to decouple the dynamic coil from the main coil. Decoupling structures are well known in the art.

Focus coil 120, as will be described in more detail below, modifies the field strength of lens 100 to change the focal plane of the lower portion of the system. It is important to mount the focus coil in proximity to the lens so that the effect of the focus coil is to modify the field strength of the lens, not to add a separate field to the system. Illustratively, the focal plane can be changed from the nominal plane of workpiece 250 (e.g. a semiconductor wafer or mask) to the plane denoted by numeral 260, which may contain a detector for monitoring the position or another parameter of the system.

Figure 5:
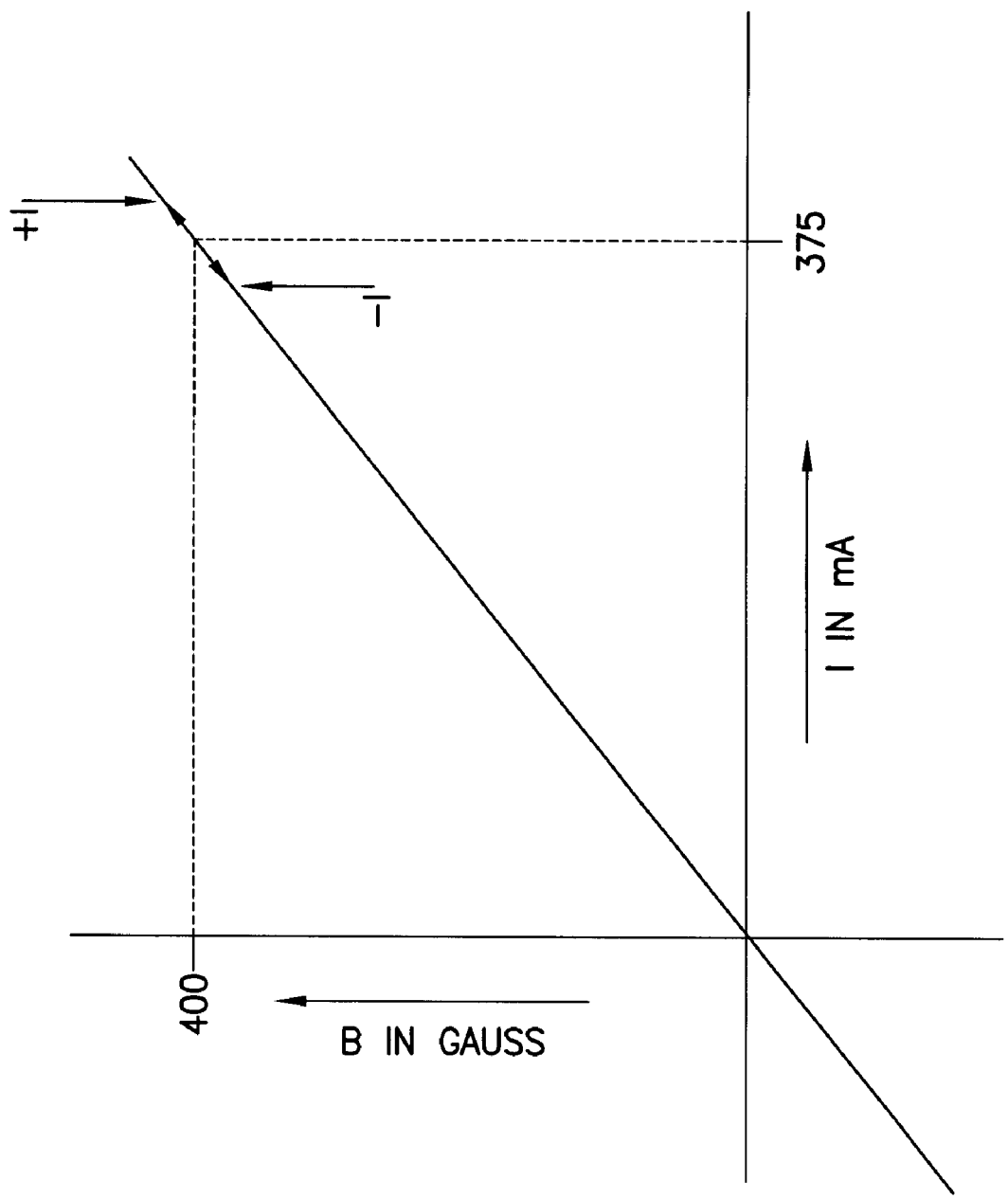
FIG. 5 illustrates the combination of the field from the focus coil with the lens field.

The single dynamic focus coil embodiment, shown in FIG. 1, can achieve two focus states at constant power by adding or subtracting to the much stronger collimator lens field. This is illustrated schematically in FIG. 5.

The remainder of the system comprises lens 200, which forms an image of the beam emitting from the upper portion at the desired image plane. In the example illustrated, lens 200 is an immersion lens, in which the workpiece plane 250 lies within the magnetic field of the lens. Magnetically permeable plate 220 provides a path for the flux lines from lens 200 to close. An immersion lens is not required for the invention and other types of lenses may be used instead.

Figure 2A:
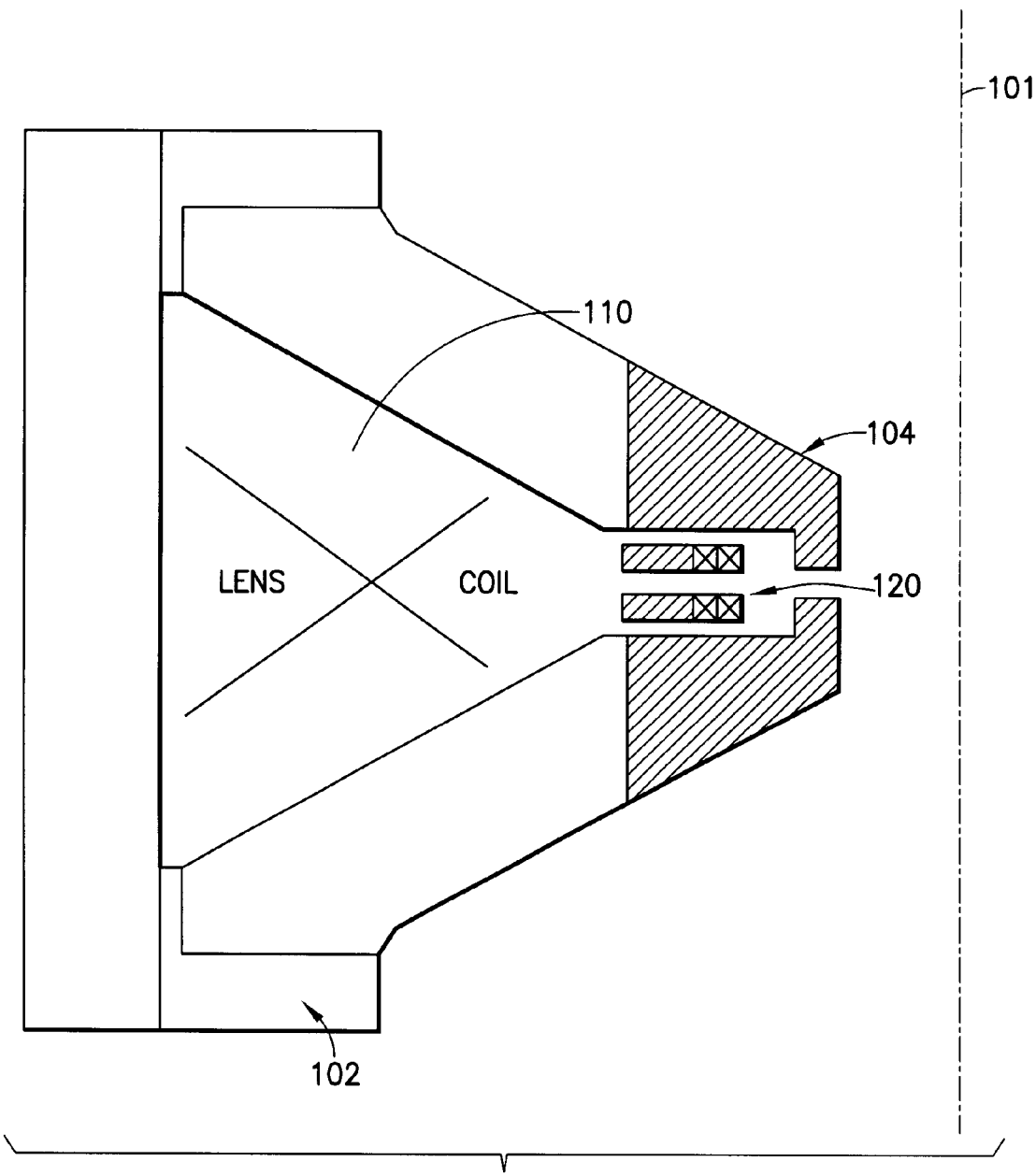
FIG. 2a shows a lens in one embodiment of the invention.
Figure 2B:
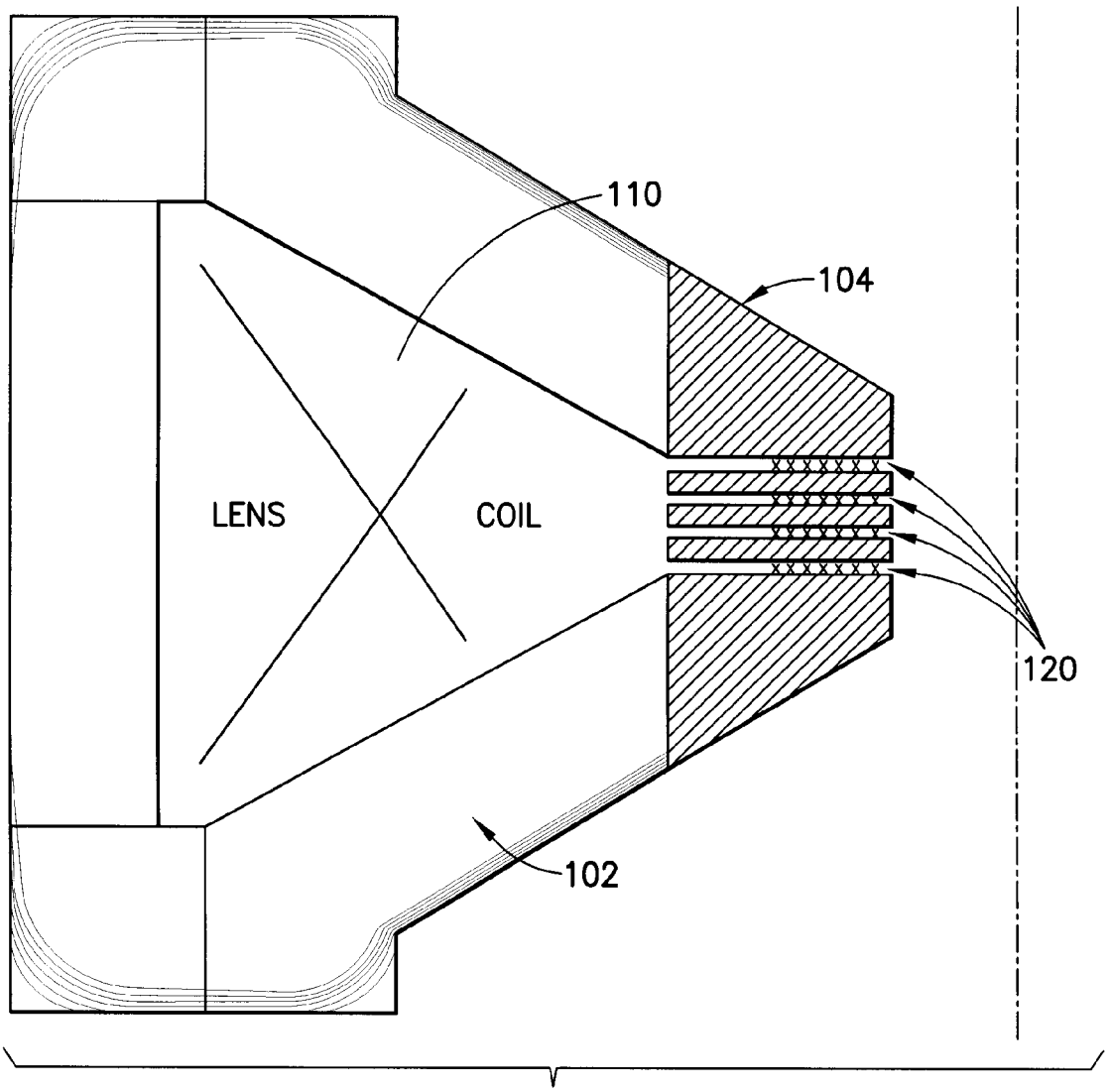
FIG. 2b shows a detail of an alternative lens for use with the invention.

FIGS. 2a and 2b illustrate alternative embodiments of dynamic focus coils combined with lenses. In FIG. 2a, a lens pole tip, 104, of ferrite has a cavity that can hold a set of coils 120 according to the invention. FIG. 2b illustrates another embodiment, in which the coils are planar and are closely surrounded by the ferrite. These and other methods of combining coil according to the invention with lenses will be readily apparent to those skilled in the art.

It is preferred, but not necessary in general, that the dynamic focus coil be located in close proximity to the lens. A "stand-alone" dynamic focus coil could be employed in a system as follows. The system focal plane would be set farther along the system axis than is desired and a dynamic focus coil according to the invention could be used to increase the focusing strength of the system (shortening the distance to the focal plane) so that the adjustment range of the system overlaps the desired focal plane position. For example, if the desired focal plane position is 100 cm, the system could be set up with a focal plane at 101 cm, with a dynamic focal coil range of 2 cm. Adjustment with the dynamic coil would then cover the range 99 cm–101 cm.

As described above, the invention comprises a dynamic focus coil (or focus adjustment element) that consumes constant power and therefore maintains a constant temperature. The element comprises a set of coils that all have the same resistance and are driven by a current of the same magnitude (and therefore consume the same power). A control system described below applies the current to a selected subset of coils (2, 3 etc.) so that the power consumed remains constant while the focus strength (ampere turns) of the element varies.

In one embodiment, the element comprises a set of coils including a first coil having a first contributing number (32) of turns wound in a first direction (clockwise, say), a pair of second coils having a second contributing number (16—half the first contributing number) of turns wound in the clockwise direction and another 16 canceling coils wound to cancel each other out so that the net magnetic field from the second coils is half that from the first coil, and succeeding pairs of coils having 8, 4, and 2 coils in the clockwise direction with the remaining coils being arranged to cancel.

Table I shows, for an example in which the maximum number of turns is 32, that there are 5 different values of contributing turns. If this set of coils has only one energized at a time, 5 coils (or fewer) can give 10 different focus values (adding or subtracting from the lens field for each number of turns). In the simplest case, one coil can give two focus values. A maximum number of turns of eight, say, could also be used. As will be shown in Tables II and III, it is desirable to have two coils for a given number of contributing turns. The number of contributing turns is shown on the left and the number of pairs of canceling turns is shown on the right.

TABLE I

Maximum turns - 32

| Number of contributing turns | Number of canceling pairs |
|---|---|
| 32 | 0 |
| 16 | 8 |
| 8 | 12 |
| 4 | 14 |
| 2 | 15 |

In operation, a controller system energizes a selected subset of coils (one at a time, two at a time or three at a time), so that the power consumed is constant. The desired number of ampere turns is provided by selecting the coils to be energized.

Table II shows such a set of 32-turn coils (having a "first number" equal to 32 in the claims) energized two at a time and the corresponding number of turns that are energized. The number on the left column is the number of contributing turns provided by the selected combination. The numbers at the top of the other columns are the number of contributing turns for that coil; e.g. in the second and third columns the number of contributing turns is two and the number of canceling coil pairs is 15. A (+) means that the coil in question is driven by a current having a first polarity and a (−) means that the current has the opposite polarity. The symbol N/A means that the number of turns on that line of the table can not be realized with two turns energized. This set can cover the range from −20× to +20× ampere-turns (where × is the number of amperes driving the coils) uniformly, using seven coils. It can cover the range from −48× to +48× with twelve gaps in the set of values (six for a positive shift and another six for negative). The number of ampere-turns will depend directly on the magnitude × of the current driving the coils.

Table III shows the same set of coils energized three at a time and the corresponding number of contributing turns that are provided. This set can cover the range from −48× to +48× turns uniformly (with no N/As as in Table II), using nine coils.

In both embodiments, a smaller number of coils having a smaller first number of turns could be used. For example, if only the range −8× to +8× is required to be covered uniformly, then five coils (2,2,4,8,16), each having sixteen turns could be used in the 3-coil embodiment and four coils, each having four turns could be used in the two-coil embodiment.

TABLE II

| | Two Coils Energized | | | | | | | | |
|---|---|---|---|---|---|---|---|---|---|
| | 2 | 2 | 4 | 4 | 8 | 8 | 16 | 16 | 32 |
| 0 | + | − | | | | | | | |
| 2 | | − | + | | | | | | |
| 4 | + | + | | | | | | | |
| 6 | | + | + | | | | | | |
| 8 | | | + | + | | | | | |
| 10 | | + | | | + | | | | |
| 12 | | | + | | + | | | | |
| 14 | | − | | | | | + | | |
| 16 | | | | | + | + | | | |
| 18 | | + | | | | | + | | |
| 20 | | | + | | | | + | | |
| 22 | N/A | | | | | | | | |
| 24 | | | | | + | | + | | |
| 26 | N/A | | | | | | | | |
| 28 | | | − | | | | | | + |
| 30 | − | | | | | | | | + |
| 32 | | | | | | | + | + | |
| 34 | | + | | | | | | | + |
| 36 | | | + | | | | | | + |
| 38 | N/A | | | | | | | | |
| 40 | | | | | + | | | | + |
| 42 | N/A | | | | | | | | |
| 44 | N/A | | | | | | | | |
| 46 | N/A | | | | | | | | |
| 48 | | | | | | | + | | + |

TABLE III

| | Three Coils Energized | | | | | | | | |
|---|---|---|---|---|---|---|---|---|---|
| | 2 | 2 | 4 | 4 | 8 | 8 | 16 | 16 | 32 |
| 0 | − | − | + | | | | | | |
| 2 | − | | − | | + | | | | |
| 4 | − | − | | | + | | | | |
| 6 | − | | | | − | | + | | |
| 8 | + | + | + | | | | | | |
| 10 | | + | + | + | | | | | |
| 12 | + | + | | | + | | | | |
| 14 | − | | | | + | + | | | |
| 16 | | | + | + | + | | | | |
| 18 | + | | | | + | + | | | |
| 20 | | | + | + | + | | | | |
| 22 | + | | + | | | | + | | |
| 24 | | | + | + | | | + | | |
| 26 | + | | | | + | | + | | |
| 28 | | | + | | + | | + | | |
| 30 | − | | | | | | + | + | |
| 32 | | | | | + | + | + | | |
| 34 | + | | | | | | + | + | |
| 36 | | + | | | | | + | + | |
| 38 | − | | | | + | | | | + |
| 40 | | | + | + | | | | | + |
| 42 | + | | | | + | | | | + |

TABLE III-continued

| | | | Three Coils Energized | | | | | |
|---|---|---|---|---|---|---|---|---|
| 2 | 2 | 4 | 4 | 8 | 8 | 16 | 16 | 32 |
| 44 | | + | | + | | | | + |
| 46 | - | | | | + | | | + |
| 48 | | | | | + | + | | + |

Figure 4:
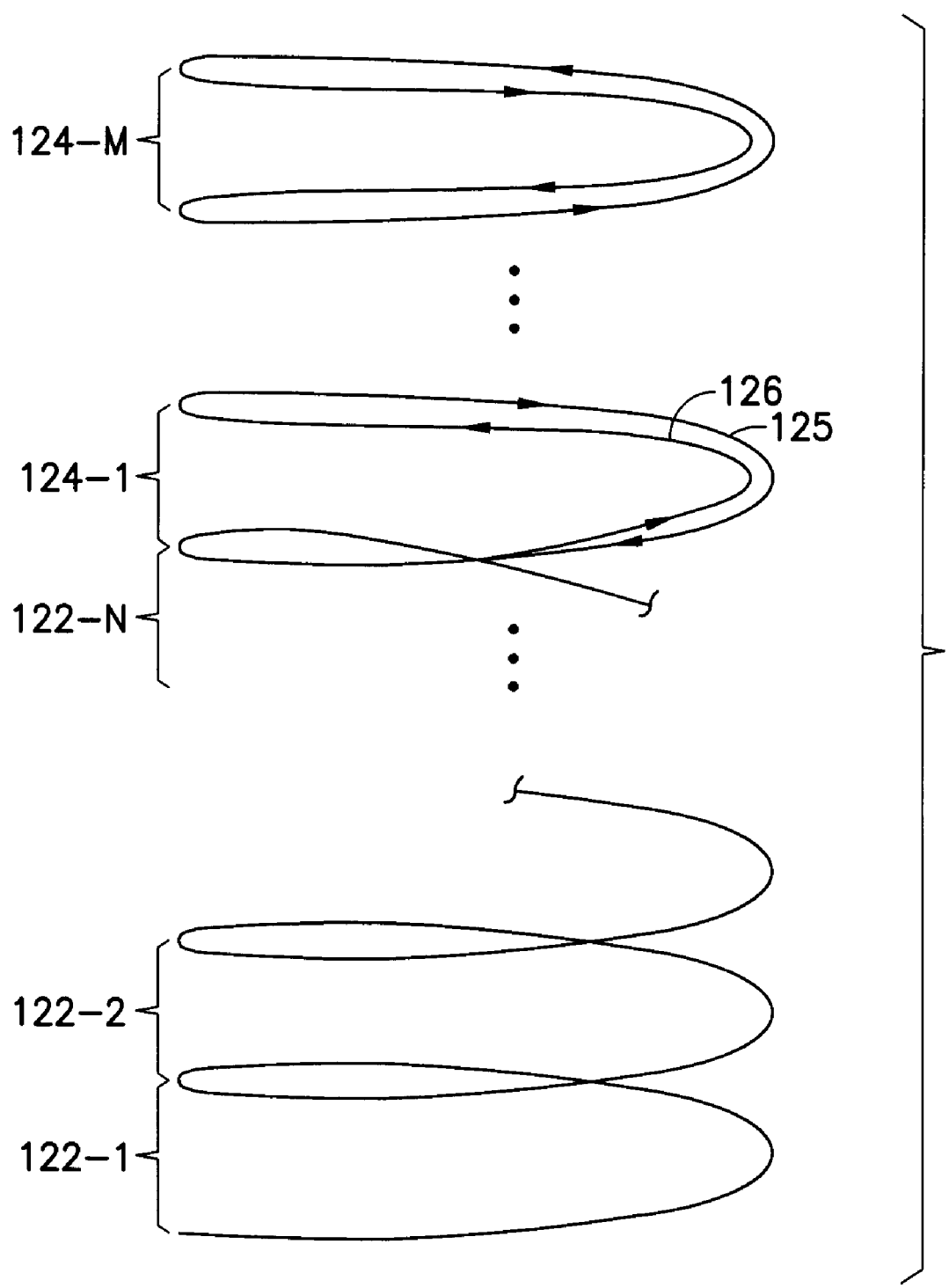
FIG. 4 shows an exploded perspective view of a coil according to the invention.

Referring now to FIG. 4, there is shown in exploded perspective the structure of a typical coil having turns made from the same material. Turns 122-1 to 122-N are the contributing turns, wound counterclockwise in this example. Turns 124-1 to 124-M are the canceling pairs. In this example, each canceling pair comprises two turns, 125 and 126, wound in the opposite sense and physically close together. This proximity is preferable, but not required, and there could be a set of clockwise turns followed by a set of counterclockwise turns.

It is not necessary in general that the number of canceling turns be as specified in Table I. In another embodiment, there could be a smaller number of canceling turns having a higher resistivity, selected such that the total resistance of the coil is equal to the resistance of the coil having the highest number of contributing turns—e.g. there could be a single pair of turns having a resistance such that the sum of the resistance of the contributing turns and of the canceling turns comes out right. The resistivity can be changed be using a different material for the canceling turns or a higher gauge (smaller diameter) wire. As yet another embodiment, the canceling pair could be a set of discrete resistors that add up to the right resistance. In this case, a coil can be configured with 1 contributing coil and the remainder of the resistance made up of one or more canceling pairs of resistive material or resistors. This may be useful where a finer degree of granularity is required. In another embodiment, one or more turns could have a higher resistivity such that the total resistance is as required and no canceling pairs would be needed.

Figure 3A:
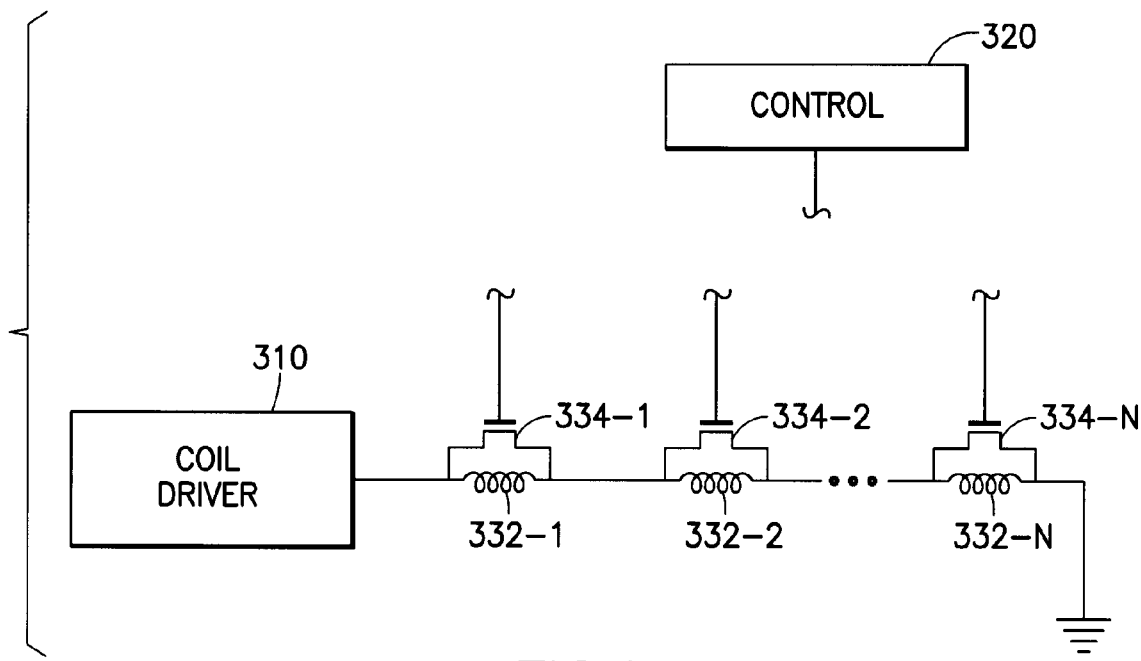
FIG. 3a shows one method of driving the coils in the invention.
Figure 3B:
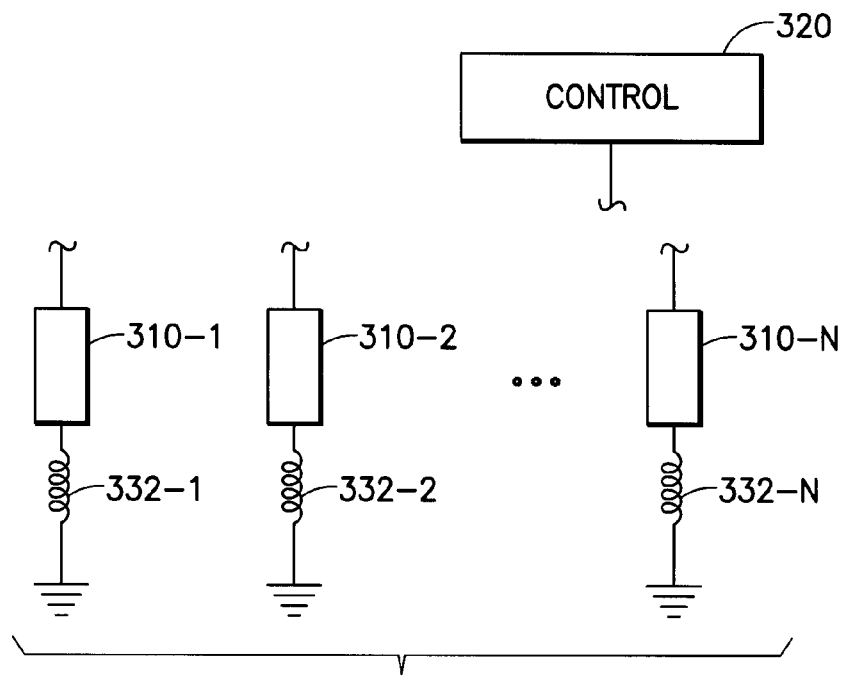
FIG. 3b shows an alternative method of driving the coils in the invention.

Referring now to FIG. 3a, there is shown one embodiment of the coil driving subsystem. Driver 310 generates the required current and directs through a series-connected set of coils 332-1 to 332-N. Controller 320 controls bypass transistors 334-1 to 334-N to bypass selected coils. Bypass transistors are shown as FETs, but they could also be bipolar transistors or even relays if the system in question allows for the slow response time of a relay. FIG. 3b illustrates an alternative embodiment in which a set of individual controllers 310-1 to 310-N is controlled by controller 320.

In many systems, such as that shown in FIG. 1, it is desired to have two focal planes and the range in between is not of interest. In that case, a suitable embodiment would be a "bias" coil that shifted the focal plane nominally by half the distance between plane 250 and plane 260, together with a "fine" control set of coils according to the invention to adjust the focal plane about those positions. Lens 100 would be set to have a focal plane at the halfway point and the bias coil would shift the focal up or down to the nominal position. The fine control set of coils would then provide further adjustment in increments that are small compared to the distance between the two planes. For example, a set of three coils energized two at a time could provide −6× to +6× uniform variation around the nominal value. The bias coil would not, in general, be driven at the same current as is used in the set of fine control coils.

Another embodiment comprises a "coarse" set of coils for coarse adjustment and a "fine" set of coils for interpolating between the values of the coarse set. For example, if a set of three coils (2, 2 and 4 contributing turns, with the first number equal to four) is driven by 1 ampere and energized according to Table II, the set can cover the range from −6 to +6 ampere turns in increments. of 2 ampere-turns. If a second set of four coils having the same parameters is driven by ¼ ampere, it will cover the range from 0 to 2 ampere-turns in increments of ½ ampere-turns. The combination of the two sets can cover the range from −8 ampere-turns to +8 ampere-turns in increments of ½ ampere-turns. If the second set is driven by ⅛ ampere-turn, it can cover the range −1 to +1 ampere-turns in increments of ¼ ampere-turn. In that case, the combination can cover the range −7 ampere-turns to +7 ampere-turns in increments of ¼ ampere-turns.

Those skilled in the art will readily appreciate that the system is scalable—i.e. the range of ampere-turns can be set as desired by choosing the magnitude of the current to be driven through the coils. Further, the term "canceling pair" need not refer to a loop that circles all the way around the beam axis, but also covers two lengths of wire that contribute no net magnetic field and combine to give the correct resistance, whether they are in a straight line, a small coil tucked away in a convenient space, or any other geometrical layout. The embodiment of coils physically close to the contributing coils is preferred for thermal reasons, but is not essential.

While the invention has been described in terms of a limited number of embodiments, those skilled in the art will recognize that the invention can be practiced in various versions within the spirit and scope of the following claims.

We claim:

1. A magnetic focus adjustment element for operation at constant power, mounted in proximity to a magnetic lens such that the field of said element adds to the field of the lens and comprising a set of focus coils, each with the same coil resistance and consuming the same power;

at least one first coil of said set of focus coils having a first number of turns, whereby in operation said first coil alters a focal plane of said lens from a first value to a second value greater than said first value by a coil offset when said first coil is driven with first focus coil current of a first polarity and said first coil alters said focal plane of said lens from a first value to a second value less than said first value by a coil offset when said first coil is driven with second focus coil current of a second polarity and of the same magnitude as said first focus coil current.

2. A magnetic focus adjustment element according to claim 1, further comprising:

at least one second coil of said set of coils having a second number of turns, less than said first number of turns and at least two turns wound in at least one opposing pair, whereby said at least one opposing pair contribute substantially zero magnetic field, said second number and said at least one opposing pair combining to a total number of turns equal to said first number of turns.

3. A magnetic focus adjustment element according to claim 2, further comprising coil driver and controller means for energizing in operation, only one of said set of coils with a fixed current, whereby said focal plane of said lens is adjusted to one of a set of focal planes while said magnetic focus element consumes constant power.

4. A magnetic focus adjustment element according to claim 2, further comprising coil driver and controller means for energizing in operation, two of said set of coils with a fixed current, whereby said focal plane of said lens is adjusted to one of a set of focal planes while said magnetic focus element consumes constant power.

5. An element according to claim 2, further comprising:
at least one third coil of said set of coils having a third number of turns, less than said second number of turns, in said first direction and at least two turns wound in at least one opposing pair, whereby said at least one opposing pair contribute substantially zero magnetic field.

6. An element according to claim 5, in which:
two coils have said second number, which is half said first number: and
two coils have said third number, which is half said second number.

7. An element according to claim 6, in which:
said controller means is adapted to energize two of said set of coils at a time.

8. An element according to claim 6, in which:
said controller means is adapted to energize three of said set of coils at a time.

9. A magnetic focus adjustment element according to claim 1, further comprising coil driver and controller means adapted for energizing, in operation, only one of said set of coils with a fixed current, whereby said focal plane of said lens is adjusted to one of a set of focal planes while said magnetic focus element consumes constant power.

10. A magnetic focus adjustment element according to claim 9, in which said set of focus coils comprises only one coil and further comprising coil driver and controller means adapted for energizing, in operation, said one coil with a fixed current and one of two polarities, whereby said focal plane of said lens is adjusted to one of two focal planes while said magnetic focus element consumes constant power.

11. A magnetic focus adjustment element for operation at constant power, mounted in proximity to a magnetic lens such that the field of said element adds to the field of the lens and comprising a set of focus coils, each with the same coil resistance and consuming the same power;
at least one first coil of said set of focus coils having a first number of turns in a first direction; and
at least one second coil of said set of focus coils having a second number of turns, less than said first number of turns, in said first direction and resistance means having a resistance that adds to the resistance of that portion of said second coil excluding said resistance means such that the total resistance of said second coil is the same as said coil resistance.

12. A focus adjustment element for a magnetic system according to claim 11, in which a first group of said second number of turns is formed from a material having a first resistivity and said resistance means comprises a second group of said second number of turns comprising a material having a second resistivity such that the total resistance of said second coil is the same as said coil resistance.

13. An element according to claim 12, in which said second group of said second number of turns comprises at least one resistive turn including at least one discrete resistor that combines with a first group resistance of said first group to give said coil resistance.

14. An element according to claim 12, in which said second group of said second number of turns comprises at least one resistive turn including at least one discrete resistor that combines with a first group resistance of said first group to give said coil resistance.

15. A focus adjustment element for a magnetic system according to claim 11, in which a first group of said second number of turns is formed from a material having a first resistivity and said resistance means comprises a second group of said second number of turns comprising a material having a second resistivity such that the total resistance of said second coil is the same as said coil resistance.

16. A magnetic focus adjustment element for operation at constant power, mounted in proximity to a magnetic lens such that the field of said element adds to the field of the lens and comprising a set of coarse coils, each with the same coarse coil resistance and consuming the same power and a set of fine coils, each with the same fine coil resistance and consuming the same power;
at least one first coarse coil of said set of coarse coils having a first coarse number of turns wound in a first coarse direction, whereby in operation said first coarse coil alters a focal plane of said lens from a first value to a second value greater than said first value by a coarse coil offset when said first coarse coil is driven with first focus coarse coil current of a first polarity and said first coarse coil alters said focal plane of said lens from a first value to a second value less than said first value by said coarse coil offset when said first coarse coil is driven with second coarse focus coil current of a second polarity and of the same magnitude as said first coarse focus coil current, further comprising coarse coil driver and controller means for energizing in operation a fixed coarse coil number of at least one of said set of coarse coils with a fixed coarse current, whereby said focal plane of said lens is adjusted to one of a set of coarse focal planes while said magnetic focus element consumes constant power;
at least one first fine coil of said set of fine coils having a first fine number of turns wound in a first fine direction, whereby in operation said first fine coil alters a focal plane of said lens from a first value to a second value greater than said first value by a fine coil offset less than said coarse coil offset, when said first coil is driven with first fine focus coil current of a first polarity and said first fine coil alters said focal plane of said lens from a first value to a second value less than said first value by said fine coil offset when said first fine coil is driven with second fine focus coil current of a second polarity and of the same magnitude as said first fine focus coil current, further comprising fine coil driver and controller means for energizing in operation, a fixed fine coil number of at least one of said set of fine coils with a fixed fine current, whereby said focal plane of said lens may be adjusted to one of a set of fine focal planes intermediate to two of said coarse focal planes while said magnetic focus element consumes constant power.

17. An element according to claim 16, in which said set of coarse coils comprises one member and said set of fine coils comprises at least one member.

18. An element according to claim 17, in which said set of fine coils comprises at least three members and said fine coil driver and controller means is adapted to drive two of said set of fine coils simultaneously.

19. An element according to claim 17, in which said set of fine coils comprises at least three members and said fine coil driver and controller means is adapted to drive three of said set of fine coils simultaneously.

20. An element according to claim 16, in which said set of coarse coils comprises at least three members and said set of fine coils comprises at least three members.

21. An element according to claim 20, in which said fine coil driver and controller means is adapted to drive two of said set of fine coils simultaneously.

22. An element according to claim 20, in which said fine coil driver and controller means is adapted to drive three of said set of fine coils simultaneously.

23. A magnetic focus adjustment element for operation at constant power and comprising a set of focus coils, each with the same coil resistance and consuming the same power;

at least one first coil of said set of focus coils having a first number of turns;

at least one second coil of said set of coils having a second number of turns, less than said first number of turns and at least two turns wound in at least one opposing pair, whereby said at least one opposing pair contribute substantially zero magnetic field, said second number and said at least one opposing pair combining to a total number of turns equal to said first number of turns.

24. A magnetic focus adjustment element according to claim 23, further comprising coil driver and controller means adapted for energizing, in operation, only one of said set of coils with a fixed current, whereby said focal plane of said lens is adjusted to one of a set of focal planes while said magnetic focus element consumes constant power.

25. A magnetic focus adjustment element according to claim 23, further comprising:

coil driver and controller means for energizing in operation, two of said set of coils with a fixed current, whereby said focal plane of said lens is adjusted to one of a set of focal planes while said magnetic focus element consumes constant power.

26. An element according to claim 23, further comprising:

at least one third coil of said set of coils having a third number of turns, less than said second number of turns, in said first direction and at least two turns wound in at least one opposing pair, whereby said at least one opposing pair contribute substantially zero magnetic field.

27. An element according to claim 26, in which:

two coils have said second number, which is half said first number: and two coils have said third number, which is half said second number.

28. An element according to claim 27, in which:

said controller means is adapted to energize two of said set of coils at a time.

29. An element according to claim 27, in which:

said controller means is adapted to energize three of said set of coils at a time.

30. A focus adjustment element for a magnetic system comprising a set of focus coils, each with the same coil resistance and consuming the same power;

at least one first coil of said set of focus coils having a first number of turns in a first direction; and at least one second coil of said set of focus coils having a second number of turns, less than said first number of turns, in said first direction and resistance means having a resistance that adds to the resistance of that portion of said second coil excluding said resistance means such that the total resistance of said second coil is the same as said coil resistance.

\* \* \* \* \*